(12) United States Patent
Maehara et al.

(10) Patent No.: US 9,680,099 B2
(45) Date of Patent: Jun. 13, 2017

(54) METHOD FOR FORMING ORGANIC SEMICONDUCTOR FILM

(71) Applicant: FUJIFILM CORPORATION, Tokyo (JP)

(72) Inventors: Yoshiki Maehara, Kanagawa (JP); Yoshihisa Usami, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/835,317

(22) Filed: Aug. 25, 2015

(65) Prior Publication Data

US 2015/0364686 A1    Dec. 17, 2015

Related U.S. Application Data

(63) Continuation of application No. PCT/JP2014/054012, filed on Feb. 20, 2014.

(30) Foreign Application Priority Data

Mar. 13, 2013    (JP) .................................. 2013-050638

(51) Int. Cl.
*H01L 51/40* (2006.01)
*H01L 21/00* (2006.01)
(Continued)

(52) U.S. Cl.
CPC ...... *H01L 51/0026* (2013.01); *H01L 51/0003* (2013.01); *H01L 51/0558* (2013.01)

(58) Field of Classification Search
CPC ......... H01L 21/36; H01L 29/78; H01L 51/05; H01L 51/30; H01L 51/40
(Continued)

(56) References Cited

U.S. PATENT DOCUMENTS

2003/0180023 A1*  9/2003  Hamada ................. B82Y 20/00
                                                            385/130
2003/0217805 A1* 11/2003  Takayama ........... H01L 21/2007
                                                            156/249
(Continued)

FOREIGN PATENT DOCUMENTS

JP          2004-247716 A       9/2004
JP           2004247716 A  *    9/2004
(Continued)

OTHER PUBLICATIONS

English Translation of JP2010016212, Kitamura, Satoru, Jan. 2010.*
(Continued)

*Primary Examiner* — Yuanda Zhang
*Assistant Examiner* — Sheikh Maruf
(74) *Attorney, Agent, or Firm* — Studebaker & Brackett PC

(57) ABSTRACT

A method for forming an organic semiconductor film includes: forming a solution film by applying a solution containing an organic semiconductor material and a solvent to at least a part of a substrate; and drying the solution film by irradiating at least a part of the solution film with electromagnetic waves with a wavelength of at least 8 μm and an energy density of from 0.1 to 10 $J/cm^2$ on the surface of the solution film before the solution film dries. An organic semiconductor film having good crystallinity can be formed by the method.

8 Claims, 1 Drawing Sheet

(51) Int. Cl.
*H01L 21/42* (2006.01)
*H01L 51/00* (2006.01)
*H01L 51/05* (2006.01)

(58) Field of Classification Search
USPC .......................... 438/49, 74, 99; 257/40–43
See application file for complete search history.

(56) References Cited

U.S. PATENT DOCUMENTS

| | | | |
|---|---|---|---|
| 2005/0072021 A1* | 4/2005 | Steiger | H01L 51/0003 34/275 |
| 2006/0134918 A1* | 6/2006 | Fujii | H01L 23/48 438/694 |
| 2007/0212859 A1* | 9/2007 | Carey | H01L 21/26506 438/487 |
| 2007/0243658 A1 | 10/2007 | Hirai et al. | |
| 2007/0254456 A1* | 11/2007 | Maruyama | G06K 19/07749 438/458 |
| 2007/0292986 A1* | 12/2007 | Fujii | H01L 27/3246 438/99 |
| 2008/0023696 A1* | 1/2008 | Yukawa | B82Y 10/00 257/40 |
| 2008/0121725 A1* | 5/2008 | Nomura | B82Y 10/00 235/492 |
| 2009/0025555 A1* | 1/2009 | Lively | B01D 53/0438 95/114 |
| 2010/0015540 A1* | 1/2010 | Dinh | G03G 5/0614 430/58.8 |
| 2010/0228025 A1* | 9/2010 | Cote | B82Y 10/00 544/71 |
| 2010/0297809 A1* | 11/2010 | Imahayashi | H01L 51/0512 438/99 |
| 2011/0053064 A1* | 3/2011 | Kim | A61M 25/10 430/56 |
| 2012/0040283 A1* | 2/2012 | Heuft | G03G 5/0589 430/56 |

FOREIGN PATENT DOCUMENTS

| | | | |
|---|---|---|---|
| JP | 2005-508515 A | | 3/2005 |
| JP | 2005-211769 A | | 8/2005 |
| JP | 2005211769 A | * | 8/2005 |
| JP | 2010-016212 A | | 1/2010 |
| JP | 2010016212 A | * | 1/2010 |
| WO | 2007/119703 A1 | | 10/2007 |

OTHER PUBLICATIONS

English Translation of JP2005211769, Okazaki, Shoji, Aug. 2005.*
English Translation of JP2004247716, Aramaki, Shinji, Sep. 2004.*
International Search Report, PCT/JP2014/054012, Apr. 8, 2014.
International Preliminary Report on Patentability mailed on Sep. 24, 2015 in PCT Application No. PCT/JP2014/054012 which is related to U.S. Appl. No. 14/835,317.
An Office Action; "Notification of Reasons for Refusal" issued by the Japanese Patent Office on Jun. 21, 2016, which corresponds to Japanese Patent Application No. 2013-050638 and is related to U.S. Appl. No. 14/835,317; with English language translation.

* cited by examiner

US 9,680,099 B2

METHOD FOR FORMING ORGANIC SEMICONDUCTOR FILM

CROSS-REFERENCE TO RELATED APPLICATIONS

This application is a Continuation of PCT International Application No. PCT/JP2014/054012 filed on Feb. 20, 2014, which claims priority under 35 U.S.C. §119(a) to Japanese Application No. 2013-050638 filed on Mar. 13, 2013. Each of the above application(s) is hereby expressly incorporated by reference, in its entirety, into the present application.

BACKGROUND OF THE INVENTION

The present invention relates to a method for forming an organic semiconductor film used in thin film transistors or the like using organic semiconductor materials.

Organic semiconductor elements having organic semiconductor films (organic semiconductor layers) comprising organic semiconductor materials are used in devices using logical circuits such as TFTs (thin film transistors), RFIDs (RF tags), or memory used in liquid crystal displays or organic EL displays due to their ability to reduce weight, lower cost, and enhance flexibility.

In the production of an organic semiconductor element, one known method of forming an organic semiconductor film is a wet process such as a coating method using a coating prepared by dissolving an organic semiconductor material in a solvent.

In addition, in order to obtain an organic semiconductor film with high mobility, it is important to enhance the crystallinity of the organic semiconductor film. Therefore, various methods of improving the crystallinity of an organic semiconductor film have also been proposed in the formation of an organic semiconductor film by means of a wet process.

For example, WO 2007/119703 illustrates a method of forming an organic semiconductor film with good crystallinity with an example by applying a solution prepared by dissolving an organic semiconductor material in a solvent to a supporting member so as to form a solution film and then evaporating the solvent from the interface at the edge of the solution film that is formed, thereby moving the interface of crystal growth and forming an organic semiconductor film.

JP 2005-508515 A describes a method for drying an organic semiconductor film, wherein the treatment time is reduced in the formation of an organic semiconductor film using such a solution containing an organic semiconductor material by combining a solution film coating step and a drying step involving infrared irradiation.

In addition, focused or non-focused infrared/near-infrared laser beams with a wavelength of from 0.7 to 2 μm are illustrated with an example as infrared rays.

Furthermore, JP 2005-211769 A describes a substrate production device which, in the production of an organic EL element or the like, controls the drying process of a solution film (droplets) so as to form a dry thin film with excellent film thickness uniformity and high flatness by applying a solution containing an organic semiconductor material to a substrate and then selectively irradiating designated areas with electromagnetic waves.

Infrared light with a wavelength of from 0.8 to 20 μm is illustrated with an example as electromagnetic waves used to dry such a solution film. JP 2005-211769 A further describes that by using infrared laser beams as electromagnetic waves, the central part is selectively dried in the early stages of drying, and the concentration of energy gradually weakens thereafter so that the energy is dispersed in the latter half of the drying process, which enables uniform drying.

However, the demand for the formation of organic semiconductor films has become even more intense in recent years, and there is a demand for the emergence of a method capable of stably forming an organic semiconductor film which has better crystallinity and with which a semiconductor element with high mobility can be obtained.

An object of the present invention is to solve the problems of such conventional technology and to provide a method for forming an organic semiconductor film capable of stably forming an organic semiconductor film having good crystallinity and high mobility.

SUMMARY OF THE INVENTION

In order to achieve the foregoing object, the present invention provides a method for forming an organic semiconductor film, the method comprising: when forming an organic semiconductor film made of an organic semiconductor material, forming a solution film by applying a solution containing at least an organic semiconductor material and a solvent to at least a part of a substrate; and drying the solution film by irradiating at least a part of the solution film with electromagnetic waves with a wavelength of at least 8 μm and an energy density of from 0.1 to 10 J/cm2 on the surface of the solution film before the solution film dries.

In the method for forming an organic semiconductor film of the present invention, it is preferred that the irradiation of electromagnetic waves to the solution film is adjusted so that the energy density of the electromagnetic waves on the surface of the solution film is from 0.1 to 0.7 times the energy density of the electromagnetic waves at a focal position.

Preferably, the substrate has a transmittance of the electromagnetic waves of at least 50%.

Preferably, an entire surface of the solution film is scanned by the electromagnetic waves.

Preferably, the drying of the solution film is performed by scanning at least part of the solution film with the electromagnetic waves, and a scanning spacing of the electromagnetic waves is equal to or smaller than a spot diameter of the electromagnetic waves on the surface of the solution film.

Moreover, it is preferred that the drying of the solution film is performed by scanning at least part of the solution film with the electromagnetic waves, and a scanning speed of the electromagnetic waves is from 0.02 to 1 m/sec.

According to the present invention, in the formation of an organic semiconductor film using a solution in which an organic semiconductor material is dissolved, it is possible to stably form an organic semiconductor film having good crystallinity without inducing the abrasion, decomposition, degradation, degeneration, or the like of the organic semiconductor material.

DETAILED DESCRIPTION OF THE INVENTION

Figure 1:
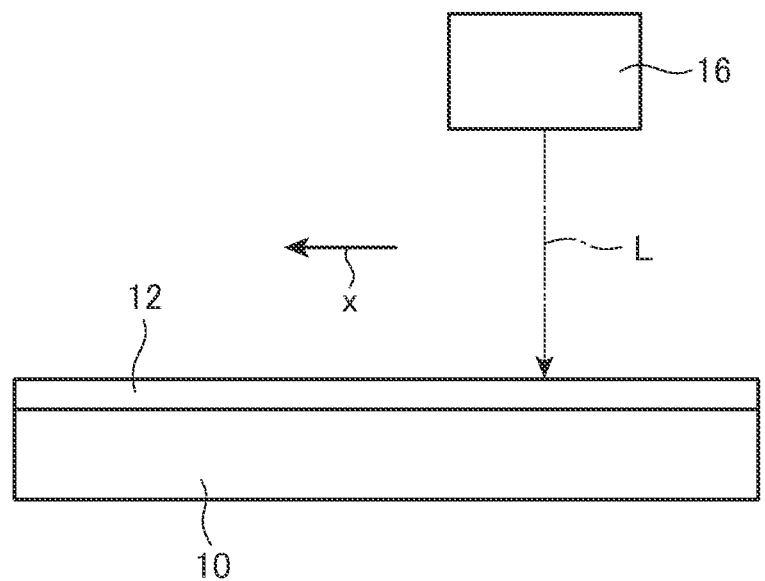
FIG. 1 is a conceptual diagram for explaining an example of the method for forming an organic semiconductor film of the present invention.

An example of the method for forming an organic semiconductor film of the present invention is illustrated conceptually in FIG. 1.

As illustrated conceptually in FIG. 1, in the method for forming an organic semiconductor film of the present invention, a solution film 12 containing an organic semiconductor material and a solvent is formed on the surface of a substrate 10, and the solution film 12 is irradiated with a laser beam L (electromagnetic waves) having a wavelength of at least 8 µm and an energy density of from 0.1 to 10 J/cm$^2$ from an optical system 16 so as to dry the solution film 12 and form an organic semiconductor film having good crystallinity on the surface of the substrate 10.

In the method for forming an organic semiconductor film of the present invention (also simply called the "formation method of the present invention" hereafter), the substrate 10 has an organic semiconductor film formed on the surface thereof. That is, the substrate 10 is a substrate or the like of an organic semiconductor element.

In the example illustrated in FIG. 1, the solution film 12 is formed over the entire surface of the tabular substrate 10, and an organic semiconductor film is formed over the entire surface of the substrate 10.

In the formation method of the present invention, tabular substances (sheet-shaped substances/films) comprising various materials such as metal, ceramic, glass, or plastic can be used as the substrate 10 as long as the solution film 12 can be formed by applying a solution containing an organic semiconductor material.

Here, the transmittance of the laser beam L with a wavelength of at least 8 µm in the substrate 10 is preferably at least 50%).

Taking this into consideration, the substrate 10 comprising a semiconductor material such as silicon or germanium is suitably used in the formation method of the present invention.

In addition, a plastic film may also be suitably used as the substrate 10.

Specific examples of materials of plastic films that can be used for the substrate 10 include thermoplastic resins such as polyester resins, methacrylic resins, methacrylic acid-maleic acid copolymers, polystyrene resins, fluorine resins, polyimides, fluorinated polyimide resins, polyamide resins, polyamide imide resins, polyether imide resins, cellulose acylate resins, polyurethane resins, polyether ether ketone resins, polycarbonate resins, alicyclic polyolefin resins, polyarylate resins, polyether sulfone resins, polysulfone resins, cycloolefin copolymers, fluorene ring-modified polycarbonate resins, alicyclic modified polycarbonate resins, fluorene ring-modified polyester resins, and acryloyl compounds.

In particular, it is preferable for the plastic film to consist of a material having heat resistance. Specifically, the film is preferably molded from a material having heat resistance satisfying at least one of the physical properties of a glass transition temperature (Tg) of at least 100° C. and a linear thermal expansion coefficient of at most 40 ppm/° C. and having high transparency with respect to laser beams, as described above. The Tg or linear thermal expansion coefficient of the plastic film can be adjusted by additives or the like. Examples of such thermoplastic resins having excellent heat resistance include polyethylene naphthalates (PEN: 120° C.), polycarbonates (PC: 140° C.), alicyclic polyolefins (for example, Zeonoa 1600 produced by the Zeon Corporation: 160° C.), polyarylates (PAr: 210° C.), polyether sulfones (PES: 220° C.), polysulfones (PSF: 190° C.), cycloolefin copolymers (COC: compound of JP 2001-150584 A: 162° C.), fluorene ring-modified polycarbonates (BCF-PC: compound of JP 2000-227603 A: 225° C.), alicyclic-modified polycarbonates (IP-PC: compound of JP 2000-227603 A: 205° C.), acryloyl compounds (compound of JP 2002-80616 A: at least 300° C.), and polyimides. These thermoplastic resins having excellent heat resistance are suitable as the substrate of the present invention. In the thermoplastic resins listed above, the numbers in parentheses indicate the Tg of each material.

Although described in detail below, in the formation method of the present invention, an organic semiconductor film having good crystallinity is formed by irradiating the solution film 12 formed on the surface of the substrate 10 with a laser beam L so as to heat the solution and evaporate and dry the solvent.

Here, when the laser beam L transmittance of the substrate 10 is low, the substrate 10 absorbs the laser beam L and generates heat. As a result, the solution in regions other than the region irradiated by the laser beam L is also heated, which causes the solvent to evaporate and dry. Portions dried in this state similar to natural drying demonstrate lower crystallinity than portions dried by laser beam L irradiation.

In contrast, by setting the laser beam L transmittance of the substrate 10 to at least 50%, it is possible to prevent such problems from occurring and to reliably heat and dry only the parts irradiated by the laser beam L. Therefore, by setting the laser beam L transmittance of the substrate 10 to at least 50%, it is possible to more stably form an organic semiconductor film having good crystallinity.

In addition, taking the above points into consideration, the laser beam L transmittance of the substrate 10 is more preferably at least 70%.

In the present invention, substances of various constitutions can be used as the substrate in the production of an organic semiconductor element in addition to the simple tabular substances of the illustrated examples.

For example, the substrate may be a substance in which an insulating layer is formed on all or part of the surface of a supporting member (substrate of a semiconductor element), a substance in which a gate electrode is formed on a supporting member and the supporting member and the gate electrode are covered to form an insulating layer, or a substance in which an insulating layer is formed on the surface of a supporting member serving as a gate electrode and a source electrode and a drain electrode are formed thereon.

That is, the method for forming an organic semiconductor film of the present invention can be used to form an organic semiconductor film (organic semiconductor layer) in the production process of various known organic semiconductor elements such as bottom gate/bottom contact type, top gate/bottom contact type, bottom gate/top contact type, and top gate/bottom contact type elements.

The various substances illustrated as examples of the substrate 10 described above can be used as the supporting members of these substrates.

In the method for forming an organic semiconductor film of the present invention, the solution film 12 is formed by applying a solution to the surface of such a substrate 10.

The solution (coating/coating solution) serving as the solution film 12 is formed by dissolving an organic semiconductor material in a solvent.

In the present invention, various known materials that are used in organic semiconductor films formed by so-called wet processes such as coating methods can be used as organic semiconductor materials in the production of an organic semiconductor element.

Specific examples include pentacene derivatives such as 6,13-bis(triisopropylsilylethynyl)pentacene (TIPS pentacene), anthradithiophene derivatives such as 5,11-bis(triethylsilylethynyl)anthradithiophene (TES-ADT), benzodithiophene (EDT) derivatives, benzothienobenzothiophene (BTBT) derivatives, dinaphthothienothiophene (DNTT) derivatives, 6,12-dioxaanthanthrene (perixanthenoxanthene) derivatives, naphthalene tetracarboxylic acid diimide (NTCDI) derivatives, perylene tetracarboxylic acid diimide (PTCDI) derivatives, polythiophene derivatives, poly(2,5-bis(thiophene-2-yl)thieno[3,2-b]thiophene) (PBTTT) derivatives, tetracyanoquinodimethane (TCNQ) derivatives, oligothiophenes, phthalocyanines, and fullerenes.

In addition, various solvents can be used as the solvent contained in the solution as long as the organic semiconductor material that is used can be dissolved.

For example, when the organic semiconductor material is TIPS pentacene, TES-ADT, or the like, aromatic compounds such as toluene, xylene, mesitylene, 1,2,3,4-tetrahydronaphthalene (tetralin), chlorobenzene, dichlorobenzene, and anisole can be suitably used.

The concentration of the solution serving as this solution film 12 should be set appropriately in accordance with the organic semiconductor or solvent that is used, the thickness of the organic semiconductor film to be formed, and the like.

In the organic semiconductor film forming method of the present invention, the solution serving as the solution film (that is, solution film 12) may also contain a thickening agent, a crystallization agent, an antioxidant, or the like as necessary in addition to the organic semiconductor material and the solvent.

Various known liquid coating methods such as spincoating, doctor knife coating, gravure coating, dip coating, and droplet dropping can be used as the coating method for the solution to the substrate 10—that is, the method of forming the solution film 12.

In addition, prior to the formation of the solution film 12, various surface treatment such as ozone treatment, ultraviolet treatment, or ultraviolet ozone treatment may be performed on the surface of the substrate 10 (the surface where the solution film 12 is formed) for the purpose of improving the wettability or the like.

The thickness (coating thickness) of the solution film 12 should be set appropriately as a thickness at which an organic semiconductor film of the target thickness can be formed in accordance with the concentration or the like of the solution.

In addition, in the example illustrated in FIG. 1, the solution film 12 is formed over the entire surface of the substrate 10. However, in the method for forming an organic semiconductor film of the present invention, the area where the solution film is formed may also be a portion of the surface of the substrate 10.

For example, in the production of a bottom gate/bottom contact type semiconductor element, when forming an organic semiconductor film, the solution film containing the organic semiconductor material may be formed in only areas corresponding to a source electrode and a drain electrode on the substrate rather than over the entire substrate surface.

In addition, when the solution film is formed on a part of the substrate 10, solution films may be formed at a plurality of locations so as to be positioned at a distance from one another.

As described above, in the example illustrated in FIG. 1, the solution film 12 formed in this way is irradiated with a laser beam L from an optical system 16 before the solution film 12 is dried.

This optical system 16 is a known laser beam optical system formed by combining a laser light source, various optical elements such as lenses or mirrors, and a laser beam modulation means.

Here, in the method for forming an organic semiconductor film of the present invention, the laser beam L is a laser beam having a wavelength of at least 8 µm and an energy density of from 0.1 to 10 $J/cm^2$ on the surface of the solution film 12.

In the formation method of the present invention, an organic semiconductor film in which an organic semiconductor material is crystallized is formed by forming the solution film 12 containing an organic semiconductor material and a solvent and, before the solution film 12 dries, irradiating the solution film 12 (that is, the wet film) with a laser beam L of a prescribed wavelength and energy density so as to heat, evaporate, and dry the solvent of the solution film 12.

Although also illustrated in the working examples below, as a result of irradiation with this laser beam L, the present invention makes it possible to form a favorably crystallized (simple crystallization or polycrystallization) organic semiconductor film with high mobility by performing suitable solvent evaporation with the laser beam L so as to dry the solution film 12 while preventing the degradation or degeneration of the organic semiconductor material, the evaporation of the organic semiconductor material, or scattering due to abrasion caused by the unnecessary heating of the organic semiconductor material.

When the wavelength of the laser beam L (electromagnetic waves) is less than 8 µm, the drying of the solution film 12 (evaporation of the solvent) cannot be performed properly due to the absorption by the organic semiconductor molecules themselves or the absorption by water contained in the substrate 10 or the atmosphere, resulting in problems in which high mobility cannot be achieved or a need to improve the energy density of the laser beam arises in order to dry the solution film 12, which leads to increases in the cost of the optical system 16.

In addition, taking the above points into consideration, the wavelength of the laser beam L is preferably from 9 to 13 µm.

In the production method of the present invention, laser beams using various known lasers such as a quantum cascade laser comprising a compound semiconductor or a carbon dioxide laser can be used as the laser beam L with a wavelength of at least 8 µm.

Of these, a laser beam with a wavelength of 9.3 µm using a carbon dioxide laser and a laser beam with a wavelength of 10.6 µm using a carbon dioxide laser are suitably used from the perspective that aromatic solvents such as toluene absorb the laser beams using the same.

In addition, in the formation method of the present invention, various electromagnetic waves with a wavelength of at least 8 µm such as electromagnetic waves produced by a ceramic light source can also be suitably used to dry the solution film 12 in addition to such a laser beam L.

As described above, in the formation method of the present invention, the energy density (energy density of a beam spot) of the laser beam L on the surface of the solution film 12 is from 0.1 to 10 $J/cm^2$.

When the energy density of the laser beam L on the surface of the solution film 12 (also simply called the "energy density of the laser beam L" hereafter) is less than 0.1 J/cm$^2$, the drying of the solution film 12 cannot be performed properly by evaporating the solvent, which leads to problems in which high mobility cannot be achieved, the organic semiconductor material is deposited randomly, or the solution film 12 flows away from the desired position before drying.

When the energy density of the laser beam L exceeds 10 J/cm$^2$, problems arise in which the abrasion, evaporation, degradation, degeneration, or the like of the organic semiconductor material occurs, or the solvent evaporates rapidly and an amorphous film is grown so that high mobility cannot be achieved.

In addition, the energy density of the laser beam L is preferably from 0.1 to 1.2 J/cm$^2$ and particularly preferably from 0.2 to 1 J/cm$^2$ from the perspective of being able to reliably avoid the problems described above and to more properly execute the drying of the solution film 12 so as to form an organic semiconductor film with high crystallinity and high mobility.

In the formation method of the present invention, the solution film 12 is preferably irradiated with the laser beam L so that the energy density of the laser beam L on the surface of the solution film 12 is from 0.1 to 0.7 times the energy density of the laser beam L at the focal position.

In order to most efficiently execute the drying of the solution film 12, it is necessary to irradiate the solution film 12 with the laser beam L so that the surface of the solution film 12 is at the focal position (focus point).

However, when the focal point is formed on the surface of the solution film 12, a portion where the energy of the laser beam L is too high develops, and the organic semiconductor material is heated unnecessarily, which may cause the degeneration or degradation of the organic semiconductor material. In addition, there is a large difference in the energy of the beam spot at the focal point between the center and peripheral portions, and surface irregularities may develop in the dried state of the solution film 12.

In contrast, in the present invention, the focal position of the laser beam L is preferably shifted from the surface of the solution film 12 (the laser beam L is defocused) so that the energy density of the laser beam L on the surface of the solution film 12 is from 0.1 to 0.7 times that of the focal position.

This makes it possible to properly set the energy density of the laser beam L on the surface of the solution film 12 and to uniformize the energy distribution of the beam spot on the surface of the solution film 12. It is therefore possible to more suitably prevent the degradation or the like of the organic semiconductor material and to execute the drying of the solution film 12 with no surface irregularities so as to form an organic semiconductor film having better crystallinity and higher mobility.

In addition, the energy density of the laser beam L on the surface of the solution film 12 is preferably from 0.2 to 0.7 times the energy density of the laser beam L at the focal position from the perspective of more favorably achieving the effects described above.

An example of a method of performing the defocusing described above is a method of setting the positions (optical distances) of the substrate 10 and the optical system 16 so that the surface of the solution film 12 is at the focal position and moving at least the substrate 10 or the optical system 16 in the optical axis direction of the laser beam L.

Here, the defocusing of the laser beam L is preferably performed so that the focal position of the laser beam L is positioned closer to the optical system 16 side than the surface of the solution film 12. That is, defocusing is preferably performed so that the focal point of the laser beam L is positioned further upstream in the advancing direction of the laser beam L than the surface of the solution film 12.

This makes it possible to reduce the loss of the laser beam L and to more properly execute the drying of the solution film 12 by irradiating the surface of the solution film 12 with a laser beam L having no disturbance so as to form an organic semiconductor film having good crystallinity and high mobility.

In the example illustrated in FIG. 1, an organic semiconductor film is formed, for example, by two-dimensionally scanning the entire surface of the solution film 12 with the laser beam L so as to dry the entire surface of the solution film 12 with the laser beam L.

A specific example is a method of repeating the process of scanning with the laser beam L in the direction of arrow x in the drawing (scan lines formed in the direction of arrow x=main scanning), moving the laser beam L by a prescribed amount in the y-direction orthogonal to the direction of arrow x (direction perpendicular to the page in FIG. 1; see FIG. 2 (B)) (secondary scanning), and then once again scanning with the laser beam L in the direction of arrow x in the drawing. As a result, the entire surface of the solution film 12 is scanned by the laser beam L (the entire surface of the solution film 12 is irradiated with the laser beam L), and the solution film 12 is completely dried by the laser beam L.

Such two-dimensional scanning of the laser beam L may be performed by moving the optical system 16, by moving the substrate 10, or by moving both the optical system and the substrate 10.

Alternatively, an optical deflector may be provided in the optical system 16, and the solution film 12 may be two-dimensionally scanned by the laser beam L by relatively moving the optical system 16 and the substrate 10 in the direction of arrow y (or in the x-direction) while deflecting the laser beam L in the direction of arrow x (or the y-direction) (main scanning).

In the method for forming an organic semiconductor film of the present invention, the scanning of the laser beam L is preferably performed so that the spacing of the centers of the spot diameter is equal to or smaller than the spot diameter of the laser beam L in accordance with the spot diameter of the laser beam L on the surface of the solution film 12. That is, in the example illustrated in FIG. 2, the spacing of the centers of the scan lines formed in the x-direction is equal to or smaller than the spot diameter of the laser beam L. This makes it possible to reliably heat the portions of the solution film to be dried and to execute the drying of the solution film 12 with no surface irregularities so as to more stably form an organic semiconductor film having good crystallinity.

The spot diameter of the laser beam on the surface of the solution film 12 should be set appropriately in accordance with the shape, size, or the like of the organic semiconductor layer to be formed.

Furthermore, the scanning speed (line speed) of the laser beam L should be set appropriately as a scanning speed at which the solvent can be evaporated properly in accordance with the strength of the laser beam L, the energy density of the laser beam (beam spot), the concentration of the solution film 12, the thickness of the solution film 12, or the like.

According to research conducted by the present inventors, the scanning speed of the laser beam L is preferably approximately from 0.02 to 1 m/sec.

In the formation method of the present invention, the irradiation of the laser beam L may basically be performed after the solution film 12 is formed and before the solution film 12 dries. However, the solution film 12 is preferably irradiated and dried with the laser beam L at a timing immediately after the solution film 12 is formed.

As a result, the segregation of the organic semiconductor material in the solution film 12 due to convection or the like is suppressed, which yields preferable results in that an organic semiconductor film having good crystallinity and high mobility can be formed with good reproducibility.

In the example above, the entire surface of the solution film 12 was scanned with the laser beam L so as to dry the entire surface with the laser beam L. However, in the present invention, the laser beam L may also scan a part of the solution film 12 (partial irradiation).

That is, when performing the two-dimensional scanning of the solution film 12 with the laser beam L as described above, it is also acceptable to scan and dry only desired areas of the solution film 12 with the laser beam L by modulating the laser beam by turning the laser beam L on/off or adjusting the strength in accordance with the desired shape (in accordance with the shape of the organic semiconductor film to be crystallized (formed)).

In this case, the solution film 12 should be dried naturally in areas not scanned (dried) by the laser beam L.

The method for forming an organic semiconductor film of the present invention was described in detail above, but the present invention is not limited to the examples described above, and various improvements or modifications may, as a matter of course, be made within a range that does not depart from the gist of the present invention.

EXAMPLES

Specific examples of the present invention will be given hereinafter to describe the method for forming an organic semiconductor film of the present invention in further detail.

Working Example 1

A thermal oxide film with a thickness of 0.3 µm was formed on one side (mirror surface) of an n-type silicon wafer doped with antimony (Sb) (volume resistivity: 0.1 Ω·cm) so as to produce a substrate 10.

In addition, TIPS pentacene was dissolved in toluene to prepare a solution with a 1 mass % concentration of TIPS pentacene.

The surface of the substrate 10 (surface of the thermal oxide film) was treated with ultraviolet rays and ozone. The prepared coating solution was then applied using a dispenser robot so as to form a solution film 12 on the surface of the substrate 10. The thickness of the solution film 12 was 5 µm.

Figure 2A:
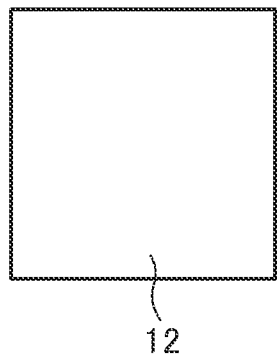
FIGS. 2A to 2C are conceptual diagrams for explaining a working example of the method for forming an organic semiconductor film of the present invention.
Figure 2B:
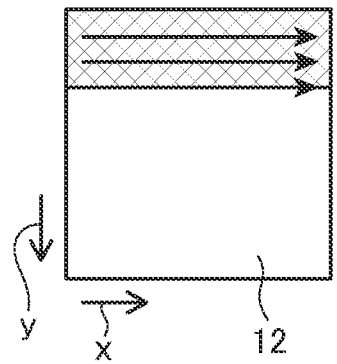
Figure 2C:
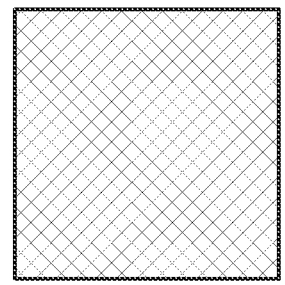

Before the solution film 12 dried, the solution film 12 was irradiated with a laser beam, and the solution film 12 was dried by two-dimensionally scanning the entire surface of the solution film 12 with the laser beam L as illustrated conceptually in FIGS. 2A to 2C while moving the optical system 16 so as to form an organic semiconductor film. The thickness of the organic semiconductor film that was formed was 0.05 µm.

The laser beam L was a laser beam with a wavelength of 9.3 µm using a carbon dioxide laser, and the output was 0.4 W. In addition, the position of the laser beam L in the optical axis direction on the optical system 16 and the substrate 10 was adjusted so that the focal point of the laser beam L was positioned on the surface of the solution film 12 (defocusing: 0 mm).

The scanning of the laser beam was performed at a scanning speed of 0.1 m/sec using a spacing (scanning pitch) of 0.01 mm between the centers of the spots of the laser beam on the surface of the solution film 12.

Two metal electrodes having square patterns of 1 mm on each side were formed at a spacing of 0.05 mm by vacuum deposition on the surface of the organic semiconductor film formed in this way (TIPS pentacene film), and an organic semiconductor element (organic thin film transistor (organic TFT)) was thereby produced.

In the configuration of this organic semiconductor element, the silicon wafer forms a gate electrode, the thermal oxide film forms a gate insulating film, and the two metal electrodes respectively form a source electrode and a drain electrode.

Working Examples 2 to 7

Organic semiconductor elements were produced by forming organic semiconductor films in the same manner as in Working Example 1, respectively: with the exception that the substrate 10 was moved to the optical system 16 side and the focal point of the laser beam was moved 0.1 mm to the substrate 10 side (defocusing: 0.1 mm, [Working Example 2]);

with the exception that the substrate 10 was moved to the optical system 16 side and the focal point of the laser beam was moved 0.2 mm to the substrate 10 side (defocusing: 0.2 mm, [Working Example 3]);

with the exception that the substrate 10 was moved to the opposite side from the optical system 16 and the focal point of the laser beam was moved 0.2 mm to the opposite side from the substrate 10 (defocusing: −0.2 mm, [Working Example 4]);

with the exception that the substrate 10 was moved to the optical system 16 side and the focal point of the laser beam was moved 1 mm to the substrate 10 side (defocusing: 1 mm, [Working Example 5]);

with the exception that the substrate 10 was moved to the opposite side from the optical system 16 and the focal point of the laser beam was moved 1 mm to the opposite side from the substrate 10 (defocusing: −1 mm, [Working Example 6]); and with the exception that the substrate 10 was moved to the optical system 16 side and the focal point of the laser beam was moved 2 mm to the substrate 10 side (defocusing: 2 mm, [Working Example 7]).

Working Example 8

An organic semiconductor element was produced by forming an organic semiconductor film in the same manner as in Working Example 1 with the exception that the output of the laser beam L was set to 4 W and the scanning speed was set to 1 m/sec.

Working Example 9

An organic semiconductor element was produced by forming an organic semiconductor film in the same manner as in Working Example 1 with the exception that the substrate 10 was moved to the optical system 16 side, the focal point of the laser beam was moved 1 mm to the substrate 10 side (defocusing: 1 mm), and the scanning pitch of the laser beam L was set to 0.08 mm.

Comparative Example 1

An organic semiconductor element was produced by forming an organic semiconductor film in the same manner as in Working Example 1 with the exception that the substrate 10 was moved to the optical system 16 side, the focal point of the laser beam was moved 1 mm to the substrate 10 side (defocusing: 1 mm), and the scanning speed of the laser beam L was set to 4 m/sec.

Comparative Example 2

An organic semiconductor element was produced by forming an organic semiconductor film in the same manner as in Working Example 1 with the exception that the substrate 10 was moved to the optical system 16 side, the focal point of the laser beam was moved 1 mm to the substrate 10 side (defocusing: 1 mm), and the output of the laser beam L was set to 4 W.

Comparative Example 3

An organic semiconductor element was produced by forming an organic semiconductor film in the same manner as in Working Example 1 with the exception that the laser beam was modified to a laser beam with a wavelength of 1.064 μm using an Nd:YVO$_4$ laser.

Comparative Example 4

An organic semiconductor element was produced by forming an organic semiconductor film in the same manner as in Working Example 1 with the exception that the solution film 12 was not irradiated with the laser beam L and the solution film 12 was dried naturally.

The various factors described above, the spot diameter of the laser beam L on the surface of the solution film 12, and the energy density of the laser beam L on the surface of the solution film 12 are shown in the table below.

<Mobility Measurement>

Each electrode of each organic semiconductor element produced in this way was connected to each terminal of a manual prober connected to a 4155C produced by Agilent Technologies, and field effect transistor (FET) evaluations were performed. Specifically, the field effect mobility ([cm$^2$/V·sec]) was calculated by measuring the characteristic of the drain current-gate voltage (Id-Vg).

The results were $5\times10^{-4}$ in Working Example 1; $5\times10^{-4}$ in Working Example 2; $1\times10^{-3}$ in Working Example 3; $2\times10^{-3}$ in Working Example 4; $2\times10^{-3}$ in Working Example 5; $2\times10^{-3}$ in Working Example 6; $1\times10^{-3}$ in Working Example 7; $1\times10^{-4}$ in Working Example 8; and $1\times10^{-4}$ in Working Example 9.

In addition, the results were $5\times10^{-5}$ in both Comparative Examples 1 and 4, and the organic semiconductor elements did not operate in Comparative Examples 2 and 3.

The results are listed together in the table below.

As shown in the table above, all of the semiconductor elements (TFTs) produced by the production method of the present invention has good mobility.

Here, Working Example 1 is an example in which the focal position of the laser beam L aligned with the surface of the solution film 12 (defocusing: 0 mm). Meanwhile, Working Examples 2 to 7 are examples in which the substrate 10 was moved in the optical axis direction of the laser beam L with respect to Working Example 1 so as to move (defocus) the focal position of the laser beam L from the surface of the solution film 12 and to change the energy density of the laser beam L on the surface of the solution film 12 in accordance with the focal position.

The energy density of the laser beam L on the surface of the solution film 12 in Working Example 1—that is, the energy density of the laser beam L at the focal position in Working Examples 1 to 7—is 1.6 [J/cm$^2$]. Accordingly, the energy density of the laser beam L on the surface of the solution film 12 with respect to the energy density of the laser beam L at the focal position is magnified 0.75 times in Working Example 2, 0.625 times in Working Examples 3 and 4, 0.25 times in Working Examples 5 and 6, and 0.125 times in Working Example 7.

In this way, by moving the focal position from the surface of the solution film 12 (defocusing), the drying of the solution film 12 is suitably executed in Working Examples 3 to 7 in which the energy density on the surface of the solution film 12 was set to 0.1 to 7 times that of the focal position, and organic semiconductor films having good crystallinity were formed with high mobility.

In contrast, in Comparative Example 1 in which the energy density of the laser beam was low, the drying effect of the laser beam L on the solution film 12 was insufficient, and the crystallization of the organic semiconductor film could not be performed sufficiently. As a result, the mobility was also low.

Conversely, in Comparative Example 2 in which the energy density of the laser beam was too high, the decomposition, degeneration, abrasion, or the like of the organic semiconductor material occurred at the time of the drying of the solution film 12 by the laser beam L. As a result, a proper organic semiconductor film could not be formed, and the organic semiconductor element did not operate.

In Comparative Example 3 in which the wavelength of the laser beam was 1.064 μm, the silicon absorbed the laser beam and the entire substrate 10 was heated. As a result, a

TABLE 1

| | Working Example | | | | | | | | | Comparative Example | | | |
|---|---|---|---|---|---|---|---|---|---|---|---|---|---|
| | 1 | 2 | 3 | 4 | 5 | 6 | 7 | 8 | 9 | 1 | 2 | 3 | 4 |
| Laser wavelength [μm] | 9.3 | 9.3 | 9.3 | 9.3 | 9.3 | 9.3 | 9.3 | 9.3 | 9.3 | 9.3 | 9.3 | 1.064 | — |
| Spot diameter [mm] | 0.08 | 0.1 | 0.13 | 0.13 | 0.31 | 0.31 | 0.54 | 0.08 | 0.31 | 0.31 | 0.06 | 0.08 | — |
| Defocusing [mm] | 0 | 0.1 | 0.2 | −0.2 | 1 | −1 | 2 | 0 | 1 | 1 | 1 | 0 | — |
| Output [W] | 0.4 | 0.4 | 0.4 | 0.4 | 0.4 | 0.4 | 0.4 | 4 | 0.4 | 0.4 | 4 | 0.4 | — |
| Scanning speed [m/sec] | 0.1 | 0.1 | 0.1 | 0.1 | 0.1 | 0.1 | 0.1 | 1 | 0.1 | 4 | 0.1 | 0.1 | — |
| Energy density [J/cm$^2$] | 1.6 | 1.2 | 1 | 1 | 0.4 | 0.4 | 0.2 | 1.6 | 0.4 | 0.01 | 21.2 | 1.6 | — |
| Scanning pitch [mm] | 0.01 | 0.01 | 0.01 | 0.01 | 0.01 | 0.01 | 0.01 | 0.01 | 0.08 | 0.01 | 0.01 | 0.01 | — |
| Mobility [cm$^2$/V·sec] | 5E−04 | 5E−04 | 1E−03 | 2E−03 | 2E−03 | 2E−03 | 1E−03 | 1E−04 | 1E−04 | 5E−05 | — | — | 5E−05 | proper organic semiconductor film could not be formed, and the organic semiconductor element did not operate.

Furthermore, in Comparative Example 4 in which the solution film 12 was dried naturally, the crystallization of the organic semiconductor film could not be performed sufficiently, and as a result, the mobility was also low.

The effect of the present invention is clear from the above results.

What is claimed is:

1. A method for forming an organic semiconductor film, the method comprising:
when forming an organic semiconductor film made of an organic semiconductor material,
forming a solution film by applying a solution containing at least an organic semiconductor material and a solvent to at least a part of a substrate;
adjusting an irradiation of electromagnetic waves to the solution film so that an energy density of the electromagnetic waves on a surface of the solution film is from 0.1 to 0.7 times an energy density of the electromagnetic waves at a focal position; and
drying the solution film by irradiating at least a part of the solution film with the electromagnetic waves with a wavelength of at least 8 µm and an energy density of from 0.1 to 10 J/cm$^2$ on the surface of the solution film before the solution film dries.

2. The method for forming the organic semiconductor film according to claim 1, wherein the substrate has a transmittance of the electromagnetic waves of at least 50%.

3. The method for forming the organic semiconductor film according to claim 1, wherein an entire surface of the solution film is scanned by the electromagnetic waves.

4. The method for forming the organic semiconductor film according to claim 1, wherein the drying of the solution film is performed by scanning at least part of the solution film with the electromagnetic waves, and a scanning spacing of the electromagnetic waves is equal to or smaller than a spot diameter of the electromagnetic waves on the surface of the solution film.

5. The method for forming the organic semiconductor film according to claim 1, wherein the drying of the solution film is performed by scanning at least part of the solution film with the electromagnetic waves, and a scanning speed of the electromagnetic waves is from 0.02 to 1 m/sec.

6. The method for forming the organic semiconductor film according to claim 1, wherein a defocusing is performed by shifting the focal position of the electromagnetic waves from the surface of the solution film so that the energy density of the electromagnetic waves on the surface of the solution film is from 0.1 to 0.7 times the energy density of the electromagnetic waves at the focal position.

7. The method for forming the organic semiconductor film according to claim 6, wherein the defocusing is performed by setting optical distances of the substrate and an optical system irradiating the electromagnetic waves so that the surface of the solution film is at the focal position and moving at least the substrate or the optical system in an optical axis direction of the electromagnetic waves.

8. The method for forming the organic semiconductor film according to claim 7, wherein the defocusing is performed so that the focal point of the electromagnetic waves is positioned further upstream in an advancing direction of the electromagnetic waves than the surface of the solution film.

* * * * *